United States Patent [19]

Ferry

[11] Patent Number: 5,341,419

[45] Date of Patent: Aug. 23, 1994

[54] CAPACITIVE UNBALANCING FOR REDUCTION OF DIFFERENTIAL MODE CROSS-TALK

[75] Inventor: Julian J. Ferry, Kernersville, N.C.

[73] Assignee: The Whitaker Corporation, Wilmington, Del.

[21] Appl. No.: 933,267

[22] Filed: Aug. 21, 1992

[51] Int. Cl.$^5$ .......................... H04B 3/32; H04J 3/10; H04M 9/00

[52] U.S. Cl. .................... 379/417; 379/414; 370/6; 333/12

[58] Field of Search ............... 379/417, 414, 415, 416, 379/417; 371/70; 370/6; 333/1, 12; 439/894

[56] References Cited

U.S. PATENT DOCUMENTS

| | | | |
|---|---|---|---|
| 1,888,580 | 11/1932 | Latimer | 379/417 |
| 1,995,454 | 3/1935 | Hunter | 379/417 |
| 2,080,217 | 5/1937 | Weaver | 379/417 |
| 2,943,272 | 6/1960 | Feldman | 379/417 |
| 4,042,893 | 8/1977 | Hofer et al. | 333/12 |
| 4,293,739 | 10/1981 | Iijima | 379/417 |
| 4,875,205 | 10/1989 | Huang | 375/36 |

*Primary Examiner*—James L. Dwyer
*Assistant Examiner*—Scott L. Weaver

[57] ABSTRACT

A device for reducing or eliminating differential mode cross-talk between data communication channels (CH1 and CH2) in a balanced communication system by coupling one or more auxiliary capacitances (C100) across the transmission lines (A, $\bar{A}$, B, and $\bar{B}$) between the two channels (CH1 and CH2), thereby augmenting the intrinsic capacitive couplings ($CA_{AB}$, $C_{A\bar{B}}$, $C_{B\bar{A}}$, and $C_{\bar{B}\bar{A}}$) and leakage between the channels in order to net the differential cross talk signal to zero.

2 Claims, 3 Drawing Sheets

CAPACITIVE UNBALANCING FOR REDUCTION OF DIFFERENTIAL MODE CROSS-TALK

FIELD OF THE INVENTION

The present invention relates to differential data communication and, in particular, to the use of an auxiliary capacitance coupled between data transmission lines of two differential communication channels for reducing cross-talk therebetween.

BACKGROUND OF THE INVENTION

In balanced communication systems, serial data transmission takes place over communication channels in differential mode, and each channel constitutes a complementary pair of transmission lines. It will be appreciated by those skilled in the art that one of the transmission lines is positive, and the other one is negative. Each transmitted bit of data is represented by a differential signal appearing between the two lines, the difference being between a first signal transmitted over positive transmission line and the complement which is transmitted over the negative line of the pair.

Such communication systems often employ numerous communication channels, and the physical routing of cables in such systems often creates an amalgam of intertwined transmission lines. An intrinsic capacitive coupling is formed between every pair of proximate transmission lines, and in a balanced system these intrinsic capacitive couplings often cause noise known as "cross-talk."

Referring to FIG. 1, the incidence of cross-talk may be explained with reference to a generic two-channel balanced communication system. The system includes a first channel CH1 formed by a pair of differential transmission lines positive A and negative $\overline{A}$. Likewise, the system includes a second channel CH2 formed by two differential transmission lines positive B and negative $\overline{B}$. Intrinsic capacitive couplings exist between all of the transmission lines A, $\overline{A}$, B, and $\overline{B}$ as a result of their physical proximity. Specifically, the intrinsic capacitive couplings may be represented by four capacitances occurring between the two data channels, including $C_{AB}$, $C_{A\overline{B}}$, $C_{B\overline{A}}$, and $C_{\overline{B}\overline{A}}$, respectively. Whenever data transmission is completed via any of the channels, for example, channel 2 (via lines B and $\overline{B}$), leakage of the transmitted signal will occur through capacitive couplings $C_{A\overline{B}}$, $C_{AB}$, $C_{B\overline{A}}$, and $C_{\overline{B}\overline{A}}$, and problematic cross-talk signals will appear on the other two transmission lines A and $\overline{A}$.

Since the physical proximity of the transmission lines A, $\overline{A}$, B, and $\overline{B}$ generally varies relative to each other, the magnitude of the capacitive couplings $C_{AB}$, $C_{A\overline{B}}$, $C_{B\overline{A}}$, and $C_{\overline{B}\overline{A}}$ will be non-uniform. Consequently, the relative magnitudes of the cross-talk signals will vary from line to line.

If the relative magnitudes of the cross-talk signals appearing on the two lines of a single channel are sufficiently different, then the cross-talk signals may be mistaken for differential data transmission.

As an example, we may consider a differential signal as shown in FIG. 2 which is transmitted on channel 2, the positive component being applied to transmission line B and the negative component being applied to line $\overline{B}$.

We will assume non-uniform capacitive couplings with relative magnitudes as follows:

$$C_{AB} = C_{\overline{B}\overline{A}} \qquad C_{B\overline{A}} = C_{A\overline{B}}$$
$$C_{BA} > C_{B\overline{A}} \qquad C_{\overline{B}\overline{A}} > C_{A\overline{B}}$$

The above-described relations between the capacitive couplings results in four leakage components with exemplary magnitudes as follows.

As shown in FIG. 3, leakage occurs from transmission line B through the capacitive coupling $C_{AB}$ and to line A to inject a 0 to $+1$ V cross-talk signal on line A. Further leakage occurs from transmission line $\overline{B}$ through the capacitive coupling $C_{A\overline{B}}$ and to line A to impart a 0 to $-0.5$ V cross-talk signal on line A. These two leakage components sum to yield a 0 to $+0.5$ V net cross-talk signal on line A.

Similarly, leakage occurs from transmission line B through the capacitive coupling $C_{B\overline{A}}$ and to line $\overline{A}$ to impart a 0 to $+0.5$ V cross-talk signal on line $\overline{A}$, and leakage occurs from transmission line $\overline{B}$ through the capacitive coupling $C_{\overline{B}\overline{A}}$ and to line $\overline{A}$ to impart a 0 to $-0.1$ V cross-talk signal on line $\overline{A}$. These two leakage components sum to yield a 0 to $-0.5$ V net cross-talk signal on line $\overline{A}$. This results in a 1 V differential cross-talk signal across channel 1 which may be mistaken for data transmission.

It would be greatly advantageous if the above-described cross-talk could be reduced or eliminated.

SUMMARY OF THE INVENTION

It is, therefore, an object of the present invention to reduce or eliminate cross-talk occurring across multiple channel balanced (differential) data transmission lines.

It is another object of the invention to reduce cross-talk as described above with a simple auxiliary capacitance, thereby eliminating the need for costly digital filters, etc.

In accordance with the above-described objects, the present invention provides a method and means for unbalancing the capacitive couplings between differential data transmission lines to thereby reduce the differential mode cross-talk.

The method includes coupling an auxiliary capacitance from a transmission line of a first data communication channel to a transmission line of a second data communication channel to supplement a line-to-line capacitance occurring therebetween. This way, when a cross-talk signal is coupled from the former transmission line to the latter, the auxiliary capacitance provides a path in addition to the auxiliary capacitive coupling. By coupling the auxiliary capacitance of proper value, the amplitude of the net cross-talk signal injected therethrough to the transmission line of the second data communication channel can be controlled to cancel out with the cross-talk signal injected to the other transmission line of the same second channel, thereby eliminating or at least reducing the differential mode cross-talk.

The invention also encompasses an apparatus for accomplishing the above-described method, the apparatus being an auxiliary capacitance coupled between a transmission line of said first data communication channel and a transmission line of said second data communication channel to supplement a line-to-line capacitance occurring therebetween.

BRIEF DESCRIPTION OF THE DRAWINGS

Other objects, features, and advantages of the present invention will become more apparent from the following detailed description of preferred embodiments and certain modifications thereof when taken together with the accompanying drawings in which.

DETAILED DESCRIPTION OF THE PREFERRED EMBODIMENT(S)

Figure 1:
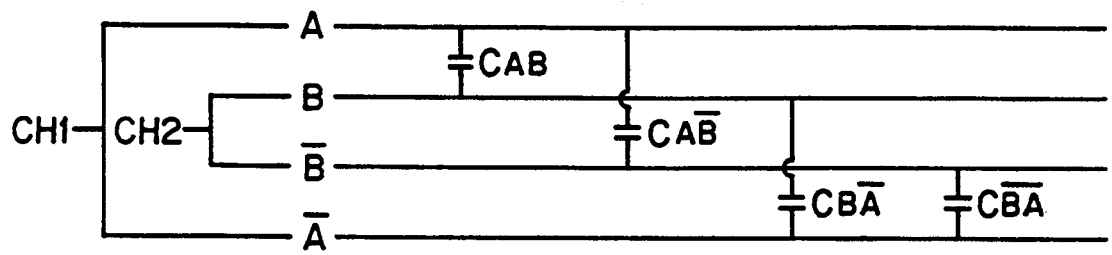
FIG. 1 is a schematic model diagram of a generic two-channel balanced communication system in which a first channel CH1 is formed by a pair of differential transmission lines A and $\overline{A}$, and a second channel CH2 is formed by two differential transmission lines B and $\overline{B}$.
Figure 2:
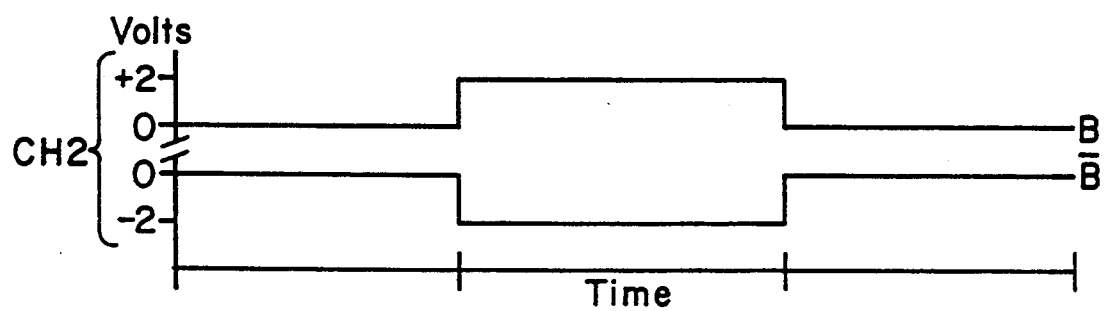
FIG. 2 is a graphical representation of a differential data transmission signal as applied to communication channel CH2, including a positive component applied to transmission line B and a negative component applied to line $\overline{B}$.
Figure 4:
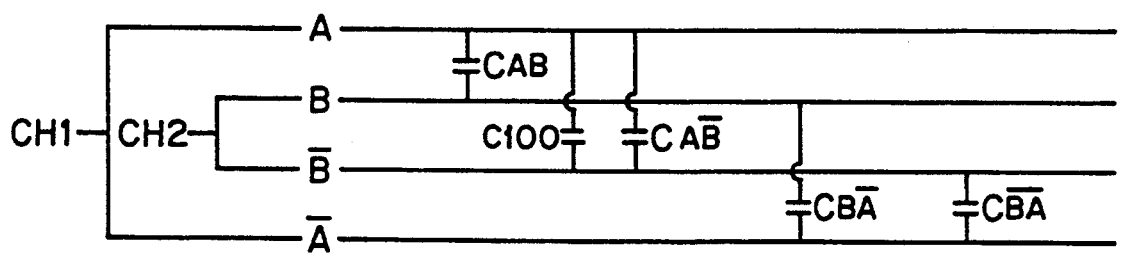
FIG. 4 is a schematic model diagram of a two-channel unbalanced communication system according to the present invention. The system of FIG. 4 is identical to that of FIG. 1 with the addition of an auxiliary capacitance C100 between transmission lines $\overline{B}$ and A.

The present invention is accomplished simply by including one or more auxiliary capacitances between the transmission lines of the balanced communication channels to thereby reduce or eliminate the differential mode cross-talk signal. For example, FIG. 4 illustrates one embodiment in the context of the same two-channel balanced system of FIG. 1. The present invention reduces the cross-talk by introducing auxiliary capacitance C100 between transmission lines $\overline{B}$ and A. The effect of auxiliary capacitance C100 will become apparent in light of the following example using the same CH2 communication as in FIG. 2.

Figure 3:
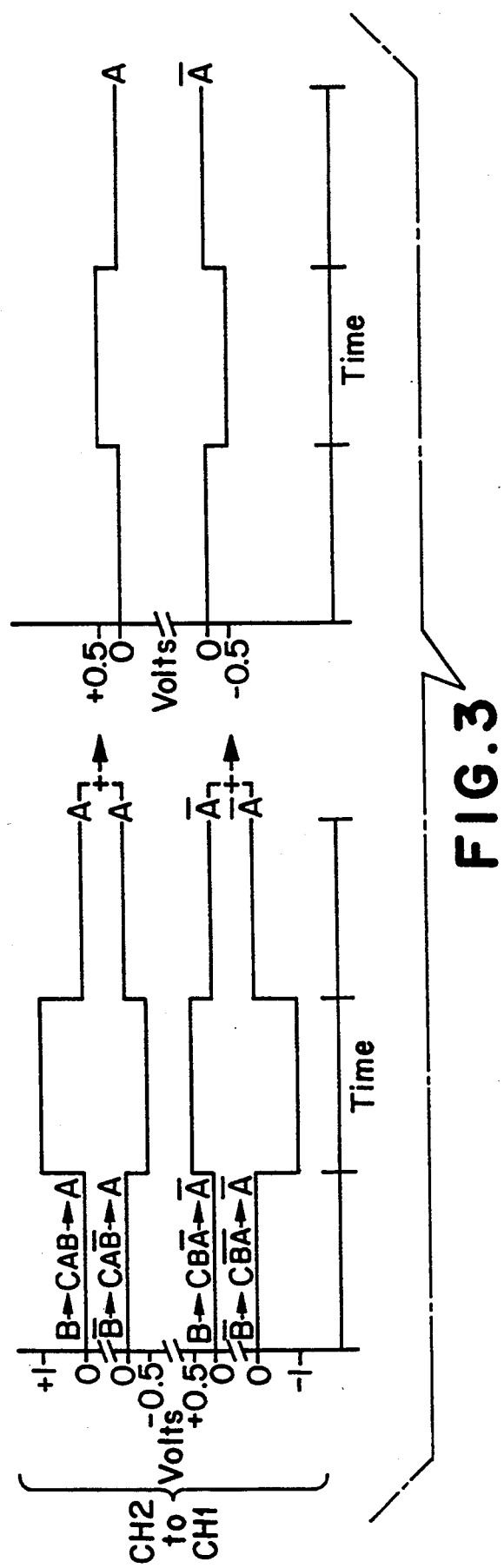
FIG. 3 is a graphical representation of the cross-talk resulting from the input signal of FIG. 2 throughout the communication system of FIG. 1.
Figure 5:
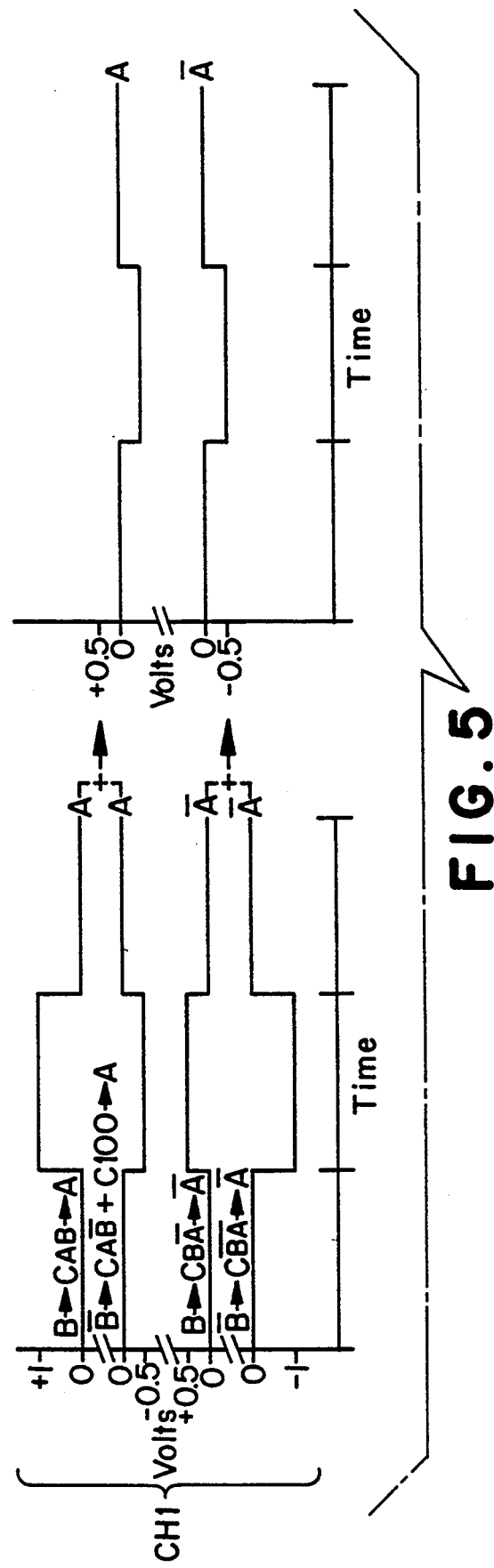
FIG. 5 is a graphical representation of the cross-talk resulting from the input signal of FIG. 2 throughout the communication system of FIG. 4, including the modulated cross-talk through capacitive coupling $C_{AB}$ and capacitor C100 which results in a zero net differential cross-talk signal across channel 2.

As shown in FIG. 5, auxiliary capacitor 100 augments the leakage through capacitive coupling $C_{AB}$, and by properly sizing the capacitance C100, the original 0 to +0.5 V leakage signal of FIG. 3 can be amplified to a 0 to $-1.5$ V signal injected on line A through capacitive coupling $C_{AB}$ and capacitor C100. The proper size of capacitance C100 must be tailored to the particular system. A larger capacitance C100 may be used as required to decrease the overall capacitive load appearing across transmission lines A and $\overline{B}$. However, an excessive capacitance C100 may distort the intended transmission on line $\overline{B}$. Hence, those skilled in the art will appreciate that some techniques well-known in the field, including measurement of the cross-talk which occurs in the balanced system of the invention, will be used to determine the proper value of C100 may be required to ascertain the proper value.

Given the further leakage which occurs from transmission line B through the capacitive coupling $C_{AB}$ and to line A (thereby imparting a 0 to $-1$ V cross-talk signal on line A), the two leakage components now sum to yield a 0 to $-0.5$ V net cross-talk signal on line A.

It is clear from FIG. 5 that the net cross-talk signal injected on line A is identical to that on line $\overline{A}$, and there is a zero net differential cross-talk signal appearing across channel 2. The cross-talk has been eliminated simply by including a properly sized auxiliary capacitance C100.

Obviously, many modifications may be made without departing from the basic spirit of the present invention. For instance, the identical results can be obtained by modifying the capacitive coupling occurring between any two lines. As an example, a properly calibrated auxiliary capacitance may be coupled across any two lines A, $\overline{A}$, B, or $\overline{B}$ to modify any single capacitive and the same results can be accomplished. Likewise, a plurality of calibrated auxiliary capacitances may be used to modify two or more capacitive couplings $C_{AB}$, $C_{AB}$, $C_{BA}$, or $C_{BA}$ to net the cross-talk to zero.

Moreover, capacitive unbalancing as described above may be combined with capacitive balancing in communication systems having more than two channels. For instance, in a three channel system, auxiliary capacitances may be added between the transmission lines of two communication channels in the manner herein described to reduce or eliminate the differential mode cross-talk signal by capacitive unbalancing. At the same time, it may be desirable in some situations to add further capacitance(s) between the third channel and other communication channel for the purpose of balancing the capacitive couplings thereto. By a combination of capacitive balancing and unbalancing in a multi-channel system, differential cross-talk can be eliminated where necessary without otherwise affecting system performance.

Accordingly, it will be appreciated by those skilled in the art that within the scope of the appended claims, the invention may be practiced other than has been specifically described herein.

I claim:

1. In a data communication system including at least first and second balanced data communication channels for transmitting serial data in a differential mode, wherein each of the balanced data communication channels includes a complementary pair of positive and negative transmission lines, wherein the data transmitted over each balanced data communication channel includes a first signal transmitted over the positive transmission line and a complementary signal transmitted over the negative transmission line, and wherein the balanced data communication channels are in a sufficiently close proximity to create respective intrinsic capacitive couplings between the positive transmission line of the first balanced data communication channel and the positive and negative transmission lines of the second balanced data communication channel, and between the negative transmission line of the first balanced data communication channel and the positive and negative transmission lines of the second balanced data communication channel, and wherein a leakage of a differential signal transmitted over the second balanced data communication channel occurring through the intrinsic capacitive couplings causes an undesirable differential mode cross-talk to appear on the positive and negative transmission lines of the first balanced data communication channel, the improvement comprising unbalancing the respective balanced data communication channels, said unbalancing achieved by an auxiliary capacitance coupled between the positive transmission line of the first balanced data communication channel and the negative transmission line of the second balanced data communication channel to supplement the intrinsic capacitance therebetween, thereby unbalancing the respective balanced data communication channels, and thereby reciprocally cancelling the differential mode cross-talk occurring, in the first unbalanced data communication channel.

2. The improved data communication system according to claim 1, wherein the auxiliary capacitance increases the intrinsic capacitance occurring between the positive transmission line of the first balanced data communication channel and the negative transmission line of the second balanced data communication channel to amplify the differential mode cross-talk coupled therebetween, whereby the amplified differential mode cross-talk tends to cancel with a cross-talk coupled to the positive transmission line of the second balanced data communication channel, thereby eliminating the differential mode cross-talk appearing across the second balanced data communication channel.

* * * * *